United States Patent
John et al.

(10) Patent No.: US 11,994,626 B2
(45) Date of Patent: May 28, 2024

(54) TECHNIQUES FOR TIME DOMAIN AUTOMATIC GAIN CONTROL FOR A FREQUENCY MODULATED CONTINUOUS WAVE (FMCW) LIGHT DETECTION AND RANGING (LIDAR) SYSTEM

(71) Applicant: Aeva, Inc., Mountain View, CA (US)

(72) Inventors: Esha John, New York, NY (US); Kumar Bhargav Viswanatha, Santa Clara, CA (US); Rajendra Tushar Moorti, Mountain View, CA (US); Mina Rezk, Haymarket, VA (US)

(73) Assignee: Aeva, Inc., Mountain View, CA (US)

( * ) Notice: Subject to any disclaimer, the term of this patent is extended or adjusted under 35 U.S.C. 154(b) by 0 days.

(21) Appl. No.: 17/963,088

(22) Filed: Oct. 10, 2022

(65) Prior Publication Data

US 2023/0032919 A1   Feb. 2, 2023

Related U.S. Application Data

(63) Continuation of application No. 17/675,857, filed on Feb. 18, 2022, now Pat. No. 11,467,267.

(60) Provisional application No. 63/220,280, filed on Jul. 9, 2021.

(51) Int. Cl.
| | |
|---|---|
| G01S 7/48 | (2006.01) |
| G01S 7/486 | (2020.01) |
| G01S 17/32 | (2020.01) |
| H03G 3/30 | (2006.01) |

(52) U.S. Cl.
CPC .......... G01S 7/4868 (2013.01); G01S 7/4802 (2013.01); G01S 17/32 (2013.01); H03G 3/3084 (2013.01)

(58) Field of Classification Search
USPC .......................................... 356/5.01
See application file for complete search history.

(56) References Cited

U.S. PATENT DOCUMENTS

| | | | |
|---|---|---|---|
| 11,119,213 B2 | 9/2021 | Bradford et al. | |
| 11,467,267 B1* | 10/2022 | John | G01S 7/4918 |
| 11,555,902 B1* | 1/2023 | John | G01S 7/4802 |
| 2006/0071851 A1 | 4/2006 | Graas et al. | |
| 2012/0140203 A1 | 6/2012 | Gusev | |
| 2012/0162373 A1 | 6/2012 | Mheen et al. | |
| 2014/0254346 A1 | 9/2014 | Rezk et al. | |
| 2018/0167602 A1 | 6/2018 | Pacala et al. | |
| 2018/0275250 A1 | 9/2018 | Adut | |
| 2018/0275274 A1 | 9/2018 | Bao et al. | |
| 2019/0154439 A1* | 5/2019 | Binder | G01B 11/26 |

(Continued)

Primary Examiner — James R Hulka
(74) Attorney, Agent, or Firm — Compass IP Law PC

(57) ABSTRACT

A frequency modulated continuous wave (FMCW) light detection and ranging (LIDAR) system includes an automatic gain control (AGC) unit to reduce the dynamic range of the signal to be processed. The system detects a return beam of a light signal transmitted to a target, having a first dynamic range in a time domain. The AGC unit can measure a power of the return beam, and apply variable gain in the time domain to reduce a dynamic range of the return beam to a lower dynamic. An analog to digital converter (ADC) generates a digital signal based on the return beam. A processor can perform time domain processing on the digital signal, convert the digital signal from the time domain to a frequency domain, and perform frequency domain processing on the digital signal in the frequency domain.

20 Claims, 10 Drawing Sheets

(56) References Cited

U.S. PATENT DOCUMENTS

| | | |
|---|---|---|
| 2019/0265351 A1 | 8/2019 | Madison et al. |
| 2019/0369217 A1 | 12/2019 | Policht |
| 2020/0209362 A1 | 7/2020 | Chawla et al. |
| 2020/0271784 A1 | 8/2020 | Bradford et al. |
| 2020/0300993 A1 | 9/2020 | Behzadi et al. |
| 2021/0096228 A1 | 4/2021 | Behzadi et al. |
| 2021/0109194 A1 | 4/2021 | Bench |
| 2021/0181309 A1 | 6/2021 | Oza et al. |
| 2021/0181320 A1 | 6/2021 | Oza et al. |
| 2021/0270965 A1 | 9/2021 | Liu et al. |
| 2021/0336594 A1 | 10/2021 | Benboudjema et al. |
| 2022/0146675 A1 | 5/2022 | Bradford et al. |
| 2022/0236393 A1* | 7/2022 | Behzadi .............. G01S 17/34 |
| 2022/0291363 A1* | 9/2022 | Behzadi .............. G01S 7/4918 |
| 2022/0334232 A1* | 10/2022 | Behzadi .............. G01S 7/4816 |
| 2023/0011155 A1* | 1/2023 | John .................. H03F 3/08 |
| 2023/0068524 A1* | 3/2023 | Oza .................. G01S 7/484 |

* cited by examiner

TECHNIQUES FOR TIME DOMAIN AUTOMATIC GAIN CONTROL FOR A FREQUENCY MODULATED CONTINUOUS WAVE (FMCW) LIGHT DETECTION AND RANGING (LIDAR) SYSTEM

This application is a nonprovisional application which is based on, and claims the benefit of priority of, U.S. application Ser. No. 17/675,857 filed Feb. 18, 2022, which in turn claims the benefit of priority of U.S. Provisional Application No. 63/220,280 filed Jul. 9, 2021.

RELATED APPLICATIONS

Field

Descriptions are generally related to light scanning systems, and more particularly, LIDAR (light detection and ranging) systems.

Background

The dynamic range of a frequency modulation continuous wave (FMCW) light detection and ranging (LIDAR) system is the difference between the highest intensity signal and lowest intensity signal received that can be reliably processed. Signals with intensities that are too high can get distorted, which can introduce harmonics and make it difficult for the system to reliably pick the true frequency peak. Signals with intensities that are too low can become indistinguishable from noise sources, which makes the signals difficult to detect.

The dynamic range of an FMCW LIDAR system can be limited by the minimum dynamic range of any individual component in the optical, electrical, and signal processing paths. A system can add bits to analog to digital converters (ADCs) and digital datapaths, which lowers the quantization noise level, and can increase the dynamic range. However, adding bits increases the power, area, and cost of the LIDAR system. Additionally, adding bits may not increase the dynamic range if optical or analog components limit the dynamic range.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, in accordance with embodiments of the present invention, a light detection and ranging (LIDAR) system can include automatic gain control (AGC). According to some embodiments, AGCs described herein can include one or more signal processors included therein or remotely and/or one or more measuring components. The AGC can adjust the dynamic range of a system while maintaining approximately the same power, area, and cost as a traditional system. One example system is a frequency modulated continuous wave (FMCW) LIDAR system, where the dynamic range of the system is improved by one or more variable gain control elements. The dynamic range of an FMCW LIDAR system can be defined as the difference between the highest intensity and lowest intensity received signal or beat signal that can be reliably processed.

The AGC can control the dynamic range of the system across optical, analog or electrical, or digital paths of the signaling, or a combination of optical, electrical, and digital paths. The AGC provides dynamic range control to reduce signal distortion due to a dynamic range that is too high, and reduce noise interference in peak detection due to dynamic range that is too low.

In one example, AGC can be provided in an optical path. In one example, AGC can be provided in analog or electrical circuitry. In one example, AGC can be provided in digital time domain processing. In one example, AGC is provided in digital frequency domain processing. AGC can be applied in a combination of one or more of the optical circuitry, analog circuitry, digital time domain processing, or digital frequency domain processing.

The system can detect a return beam of a light signal transmitted to a target, having a first dynamic range in a time domain. An analog to digital converter (ADC) can generate a digital signal based on the return beam. A processor can perform time domain processing on the digital signal, convert the digital signal from the time domain to a frequency domain, and perform frequency domain processing on the digital signal in the frequency domain. The AGC unit can measure a power of the return beam, and apply variable gain in the time domain to reduce a dynamic range of the return beam to a second dynamic range lower than the first dynamic range. The AGC unit can measure a power of the digital signal, and apply variable gain in the frequency domain to reduce a dynamic range of the signal to a second dynamic range lower than the first dynamic range.

Figure 1:
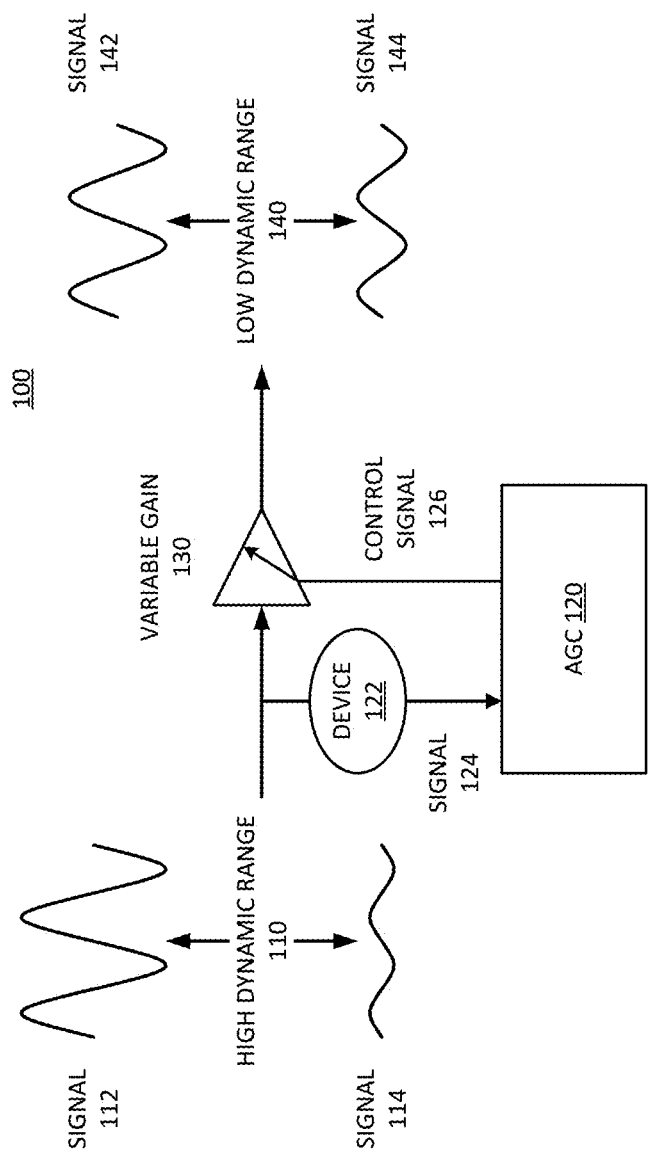
FIG. 1 illustrates an example of automatic gain control (AGC) for dynamic range control in a LIDAR system.

FIG. 1 illustrates an example of automatic gain control (AGC) for dynamic range control in a LIDAR system. System 100 represents an adjustment to dynamic range based on AGC.

Dynamic range refers to a difference between the largest possible signal power and the smallest possible signal power that needs to be reliably processed. Dynamic range can be a design specification for a LIDAR system, and can be based on the expected signals used, power budget for the system, component performance characteristics, or other factors. Performing signal processing on signals with lower dynamic range can save power, reduce optical component size, thus saving area, and can reduce the system cost (both component cost and operating cost). The LIDAR system can be designed with a datapath having a smaller dynamic range than what is specified for the components. The system can measure the power of a received signal and apply a variable gain to fit the signal within the reduced dynamic range for processing through the datapath.

A variable gain can be applied to any signal to reduce its dynamic range. Variable gain can be applied to gain up weak signals. Variable gain can be applied to attenuate strong signals. Either amplification, or attenuation, or both amplification and attenuation can be applied to adjust the dynamic range.

By applying the variable gain, a signal can be made to fit within the dynamic range of the next component in the signal chain or along the datapath. Thus, the variable gain AGC can be applied to fit dynamic range above the noise level and below the distortion level of a component. It will be understood that applying variable gain at a point in the path of the signal, whether in the optical, analog, or digital domain, will adjust the dynamic range for subsequent components in the signal path. Thus, applying a variable gain can reduce the dynamic range requirement of all subsequent signal chain components, resulting in power, area, and cost savings. The earlier AGC is applied in a signal chain, the more savings are possible.

In system 100, the difference between signal 112 with large amplitude and signal 114 with very small amplitude can be high dynamic range 110. System 100 can apply variable gain to achieve low dynamic range 140. To determine the optimal variable gain to apply, system 100 can measure the input signal level, as represented by device 122, which represents a measuring device or measuring apparatus of system 100 to generate measurement signal 124. AGC 120 represents one or more AGC circuits to apply the variable gain.

AGC 120 can receive signal 124 to indicate the measurement of the input signal, determine the desired signal levels to be within a desired dynamic range, and generate control signal 126 to apply variable gain. Control signal 126 can set one or more configuration parameters of variable gain 130 to apply the desired variable gain. The input signal level could be an average level over time or frequency or a peak level, such as instantaneous peak voltage or light intensity or peak frequency component. Variable gain 130 represents one or more components to apply variable gain to one or more signals to produce low dynamic range 140. In system 100, the result of the application of variable gain 130 can be that the high amplitude of signal 112 has been attenuated to signal 142 with lower amplitude, and the low amplitude of signal 114 has been gained or amplified to signal 144 with higher amplitude.

In one example, either signal 112 or signal 114 are adjusted by variable gain 130, but not both. For example, signal 112 can be attenuated and signal 114 can remain unchanged. Alternatively, signal 112 can remain unchanged while signal 114 is gained. The determination to gain or attenuate a signal is made based on the desired lower dynamic range.

Automatic gain control can refer to measuring the input signal level, computing the variable gain or gain range to apply, and controlling the variable gain component. Such operation can minimize the required dynamic range, which also reduces power consumption, circuit area, and cost of the rest of the signal path.

Figure 2:
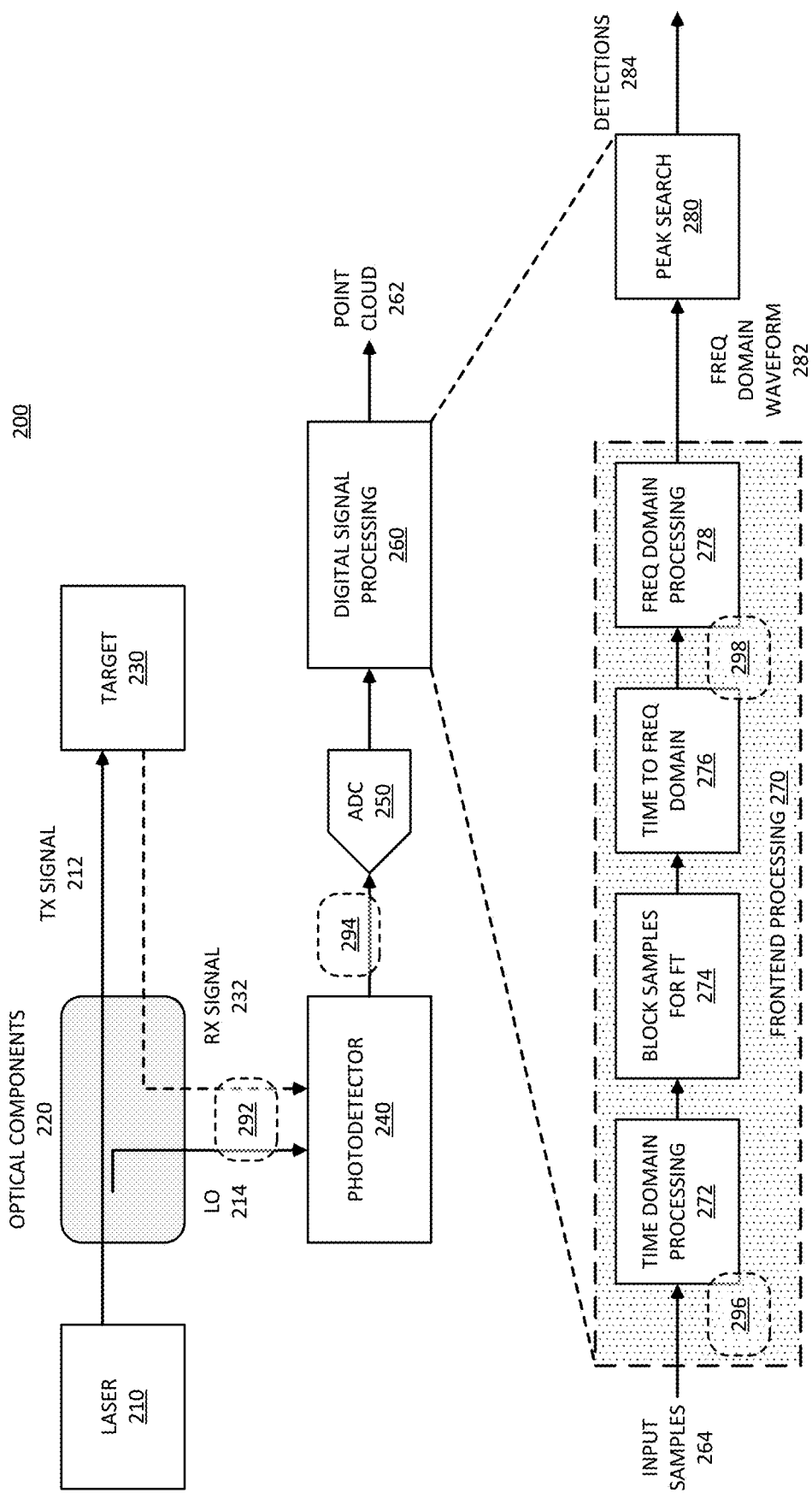
FIG. 2 illustrates an example of a LIDAR system that provides AGC for optical signal processing.

FIG. 2 illustrates an example of a LIDAR system that can provide AGC for optical signal processing. System 200 provides an example of a LIDAR system. Laser 210 represents a laser transmission system that provides a light signal or optical source for scanning the target. In some implementations, laser 210 represents an FMCW laser. Optical components 220 provide the modulation and optics to transmit TX signal 212 to target 230 and receive the reflection signal represented by RX signal 232.

Photodetector 240 can receive RX signal 232 from optical components 220 from target 230, and LO signal 214 from optical components 220 from laser 210. LO signal 214 represents a reference signal generated from the laser light signal. LO signal can represent transmission of a first portion of a light signal from laser 210 toward target 230. Photodetector 240 detects a return beam from target 230, where the return beam is the light signal of TX signal 212 as reflected back from target 230.

System 200 can condition the signal (e.g., the return beam) with ADC 250 and provide the conditioned signal for digital signal processing 260. In one example, digital signal processing 260 generates point cloud 262, which can represent a group of points of estimates of target information. A point cloud can refer to a group of target estimate values that have corresponding coordinate information to spatially map the points relative to each other.

The digital signal processing can include frontend processing 270, with time domain processing of the input samples, block samples for frequency transformation (FT), and frequency domain processing. Time domain processing 272 can apply time domain filters to improve SNR of the signal. Time domain processing 272 has input samples 264 as the input, which represent samples generated by ADC 250.

Block samples for FT (Fourier Transform) 274 represents processing on the samples to group them for frequency transformation computations. Time to frequency (FREQ) domain 276 represents the frequency transformation to provide a conversion of the signals into temporal frequency representations. Frontend processing 270 can include frequency domain processing 278 to generate a filtered frequency domain waveform 282. Frequency domain processing 278 can perform processing on the digital signal in the frequency domain.

Digital signal processing 260 can include peak search 280 of frequency domain waveform 282 to generate signal detections 284 or computations of estimates of the points of interest. The points of interest generated can be represented as a point cloud, with point having range and velocity information, associated in a relative spatial mapping.

Along various signal paths of system 200, the components can be designed or configured with a dynamic range for operation. In one example, system 200 applies AGC to adjust the dynamic range of the signal for subsequent components in the signal path. In one example, the AGC measures a power of a signal in the time domain and applies variable gain in the time domain to reduce a dynamic range of the signal to prepare the signal for subsequent components.

There are many possible locations for the application of AGC in system 200. In one example, system 200 can include optical AGC, applying a variable gain to LO signal 214 prior to photodetector 240. In one example, system 200 can include analog AGC, applying a variable gain to an analog or electrical signal prior to ADC 250. In one example, system 200 can include digital time domain AGC, applying variable gain to a digital signal prior to frequency domain conversion. In one example, system 200 can include digital frequency domain AGC, applying variable gain to a digital signal after frequency domain conversion. In the case of digital frequency domain AGC, different frequency bands could have different gains applied for further expansion of dynamic range. It should be noted that one or more AGCs described in the present disclosure can be used in combination to achieve advantages described herein.

In one example, system 200 applies AGC only at one of the identified locations. In an alternative example, system 200 can apply AGC at multiple locations. In some scenarios, the application of AGC at multiple locations would have benefit if the signal level changes naturally between the previous AGC location and the next, rather than a change due to the application of AGC. Thus, a signal level change due to components or processing can be adjusted by the application of another level of AGC. If there is no natural change in signal level between the LO, ADC, and time domain processing (which could be the case for an example of system 200), system 200 could apply AGC at only one of those locations. Signals in the same frequency range that have not been filtered would not normally see a signal level change. Thus, in typical systems, AGC can be applied at optical, analog, or digital time domain processing. Even with application of AGC at one of these locations, the application of digital frequency domain processing can still be beneficial.

In some scenarios, one or more AGCs can be placed in desirable locations within a given system (e.g., in the signal chain or signal path) based on the costs and benefits to the system. Location 292, location, 294, location 296, and location 298 represent locations in system 200 where an AGC can be employed. Location 292 represents an optical AGC in the optical path. Location 294 represents an electrical AGC in the analog processing path. Location 296 represents a digital processing AGC in the time domain processing path. Location 298 represents a digital processing AGC in the frequency domain processing path.

AGC in the digital frequency domain can be applied to a filtered band of frequencies. There can be benefits to system 200 by applying digital frequency domain AGC in conjunction with optical, analog, or digital time domain AGC for additional power savings.

Figure 3:
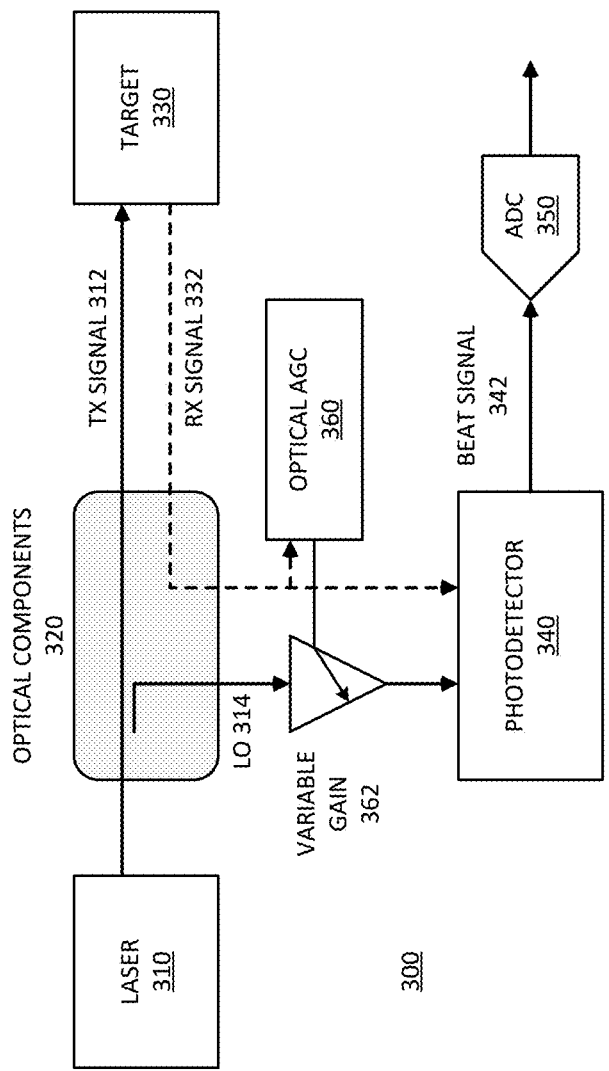
FIG. 3 illustrates an example of AGC in an LO path of a LIDAR system.

FIG. 3 illustrates an example of AGC in an LO path of a LIDAR system. System 300 represents a system in accordance with embodiments of the present disclosure. System 300 provides an example of a LIDAR system. Laser 310 represents a laser transmission system that provides a light signal or optical source for scanning the target. In some implementations, laser 310 represents an FMCW laser. Optical components 320 provide the modulation and optics to transmit TX signal 312 to target 330 and receive the reflection signal or return beam represented by RX signal 332.

Photodetector 340 can receive RX signal 332 from optical components 320 from target 330, and LO signal 314 from optical components 320 from laser 310. Photodetector 340 detects the return beam from target 330. System 300 can condition the signal (e.g., the return beam) with ADC 350 and provide the conditioned signal for signal processing.

In one example, system 300 includes an optical AGC 360, which controls variable gain of LO signal 314 in the time domain based on measurement of RX signal 332. In system 300, optical AGC 360 can measure RX signal 332 to determine the signal power and determine whether the dynamic range will be within specifications for subsequent components. Optical AGC 360 can control variable gain 362 in the LO path to adjust the beat signal power as needed.

In one example, an attenuated version of the transmit signal can be mixed with the signal received from the target to obtain a beat signal. Beat signal 342 is illustrated as an output of photodetector 340. Photodetector 340 can receive LO signal 314 and RX signal 332. The more power incident on photodetector 340, the more power it consumes. System 300 can control the LO power. The power consumed by photodetector 340 gives an estimate of the power of the received signal (RX signal 332).

When power consumption of photodetector 340 increases, optical AGC 360 can decrease the power of LO signal 314 with an optical attenuator to keep the overall power consumption constant and ensure the power of beat signal 342 is within the dynamic range of ADC 350. If LO signal 314 needs to be gained up, system 300 can use an optical amplifier in the LO path or adjust the split ratio while generating LO signal 314 from transmit signal 312.

Optical components 320 can include a splitter (not specifically illustrated) to separate TX signal 312 as a first portion of the light signal generated by laser 310 and a LO signal 314 as a second portion of the light signal. In one example, optical AGC 360 measures RX signal 332 for comparison against a threshold (e.g., the comparison performed by a signal processor or similar processor described herein). If the threshold is determined to be exceeded, optical AGC 360 can attenuate LO signal 314 with an optical attenuator; thus, variable gain 362 can represent an optical attenuator. If the threshold is determined to not be exceeded, optical AGC 360 can increase the variable gain.

In one example, optical AGC 360 compares RX signal 332 against multiple thresholds. Based on the comparison of RX signal 332 against the multiple thresholds, optical AGC 360 can turn one or more optical attenuators off; thus, variable gain 362 can represent multiple optical attenuators controlled based on multiple threshold levels.

In one example, optical AGC 360 measures RX signal 332 for comparison against a threshold, and if the threshold is determined to not be exceeded, optical AGC 360 can increase an amount of TX signal 312 relative to LO signal 314, for example, by adjustment to gain or attenuation of a splitter in optical components 320.

Figure 4:
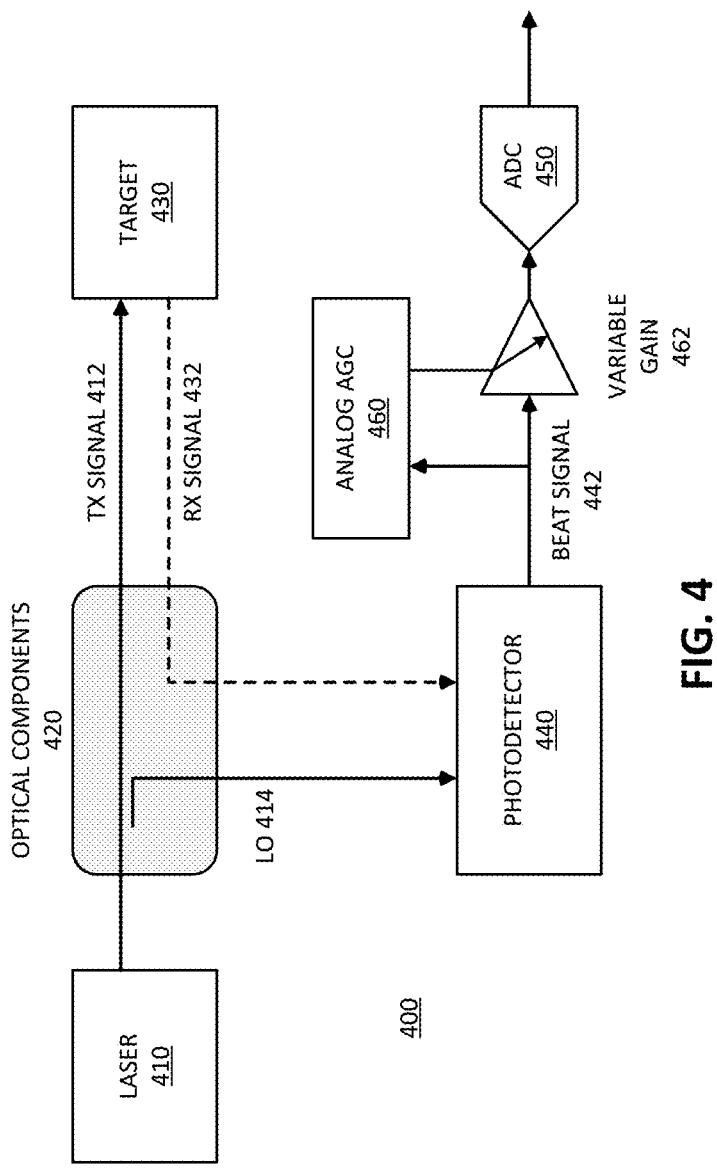
FIG. 4 illustrates an example of AGC in an analog processing path of a LIDAR system.

FIG. 4 illustrates an example of AGC in an analog processing path of a LIDAR system. System 400 represents a system in accordance with embodiments of the present disclosure. System 400 provides an example of a LIDAR system. Laser 410 represents a laser transmission system that provides a light signal or optical source for scanning the target. In some implementations, laser 410 represents an FMCW laser. Optical components 420 provide the modulation and optics to transmit TX signal 412 to target 430 and receive the reflection signal or return beam represented by RX signal 432. Optical components can include a splitter to separate LO signal 414 from TX signal 412.

Photodetector 440 can receive RX signal 432 from optical components 420 from target 430, and LO signal 414 from optical components 420 from laser 410. Photodetector 440 detects the return beam from target 430. System 400 can condition the signal (e.g., the return beam) with ADC 450 and provide the conditioned signal for signal processing. In one example, RX signal 432 can be mixed with LO signal 414 to obtain a beat signal. Beat signal 442 is illustrated as an output of photodetector 440.

In one example, system 400 includes analog AGC 460, which represents an analog or electrical AGC. In system 400, analog AGC 460 can measure beat signal 442 generated by photodetector 440 to determine average power or peak instantaneous voltage. The measurement enables analog AGC 460 to determine the amount of variable gain 462 needed to ensure the resulting signal lies within the dynamic range of ADC 450. The application of variable gain 462 resulting from analog AGC 460 can enable the use of ADC 450 in system 400 with fewer output bits, or lower full-scale voltage, or a combination of lower voltage and fewer output bits. Using fewer bits or lower voltages can save power, area, and cost as compared to a system that does not use AGC in the manner described herein.

In one example, system 400 includes additional analog circuitry to measure the input signal level, such as an envelope detector. System 400 can provide variable gain 462 with, for example, a variable gain amplifier or other electronic circuit.

Figure 5:
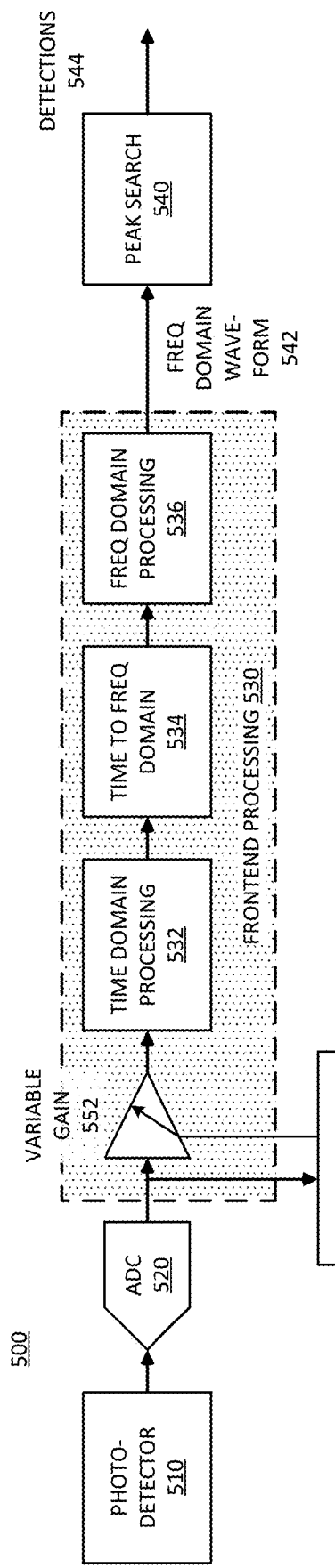
FIG. 5 illustrates an example of AGC in time domain digital processing of a LIDAR system.

FIG. 5 illustrates an example of AGC in time domain digital processing of a LIDAR system. System 500 represents a system in accordance with embodiments of the present disclosure. System 500 does not illustrate the optical components.

System 500 can detect a return beam signal with photodetector 510 and condition the signal with ADC 520. System 500 provides the conditioned signal for signal processing by frontend processing 530. In one example, frontend processing 530 includes time domain processing 532, time to frequency (FREQ) domain 534, and frequency (FREQ) domain processing 536. Time domain processing 532 can perform time domain filtering of the input signal.

Time to frequency domain 534 represents a frequency transformation to provide a conversion of the signal into a temporal frequency representation. Frequency domain processing 536 can perform processing or filtering on the digital signal in the frequency domain to generate a frequency domain waveform 542. System 500 can include peak search 540 of frequency domain waveform 542 to generate signal detections 544 or computations of estimates of the points of interest, such as a point cloud.

In one example, system 500 includes digital time domain AGC 550 prior to time domain processing 532. Digital time domain AGC 550 can measure the output signal level of ADC 520 and adjust the signal (e.g., gain the signal or reduce the signal power) prior to further processing. Digital time domain AGC 550 can control variable gain 552 to adjust the signal levels.

After application of variable gain 552 provided by digital time domain AGC 550, system 500 can use fewer data path bits in the signal processing components of frontend processing 530, which saves power, area, and costs. Each downstream component (time domain processing 532, time to frequency domain 534, and frequency domain processing 536) can use fewer bits as compared to a traditional system that does not use AGC.

In one example, system 500 can perform a power measurement of the input signal level from ADC 520 to frontend processing 530 such as a sum of squares of input data or simply measuring peak instantaneous input (e.g., max of input data) over a window of samples. In one example, system 500 can apply variable gain 552 by choosing a subset of contiguous bits to forward to the rest of the signal chain (the downstream processing components). Thus, certain bits can be selected for processing, and other bits will be ignored for the processing. In one example, system 500 performs scaling and/or rounding prior to selecting the bits for processing.

In one example, digital time domain AGC 550 compares the digital signal level to a threshold and adjusts the digital signal with digital multiplication, provided the digital signal is not above the threshold. In one example, the threshold can be multiple thresholds, with different levels of multiplication applied based on different thresholds.

Figure 6:
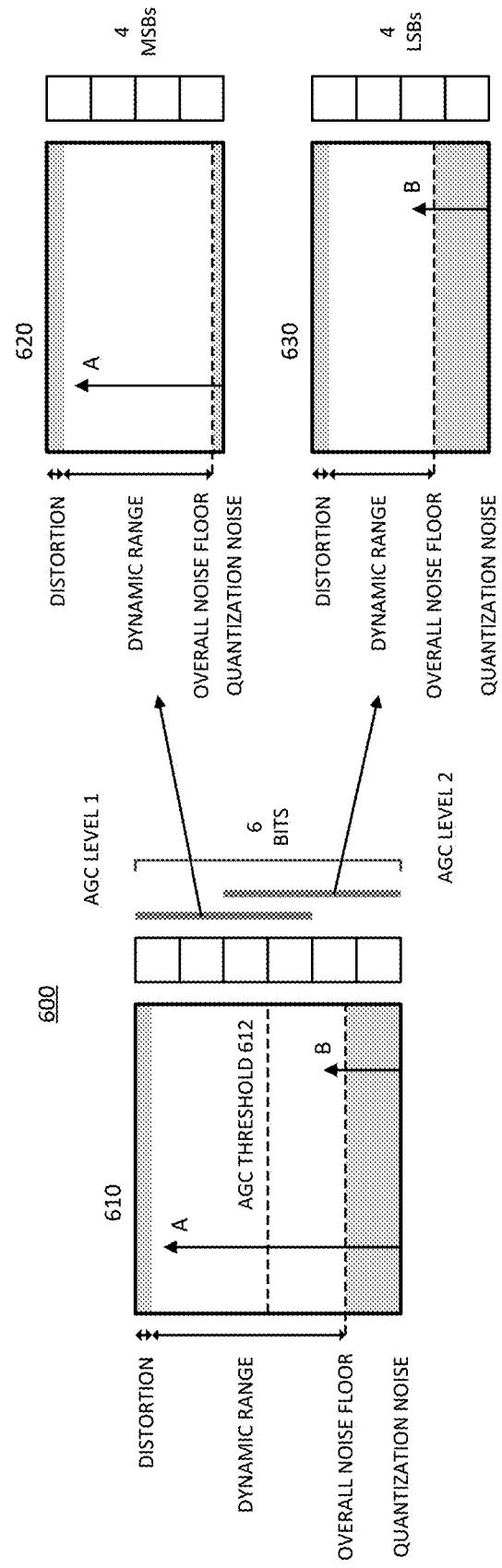
FIG. 6 illustrates an example of digital time domain AGC operation.

FIG. 6 illustrates an example of digital time domain AGC operation. System 600 illustrates bits selection in accordance with an example of system 500. The simplest implementation of digital AGC, whether in the time domain or the frequency domain, is for the processing component(s) to choose a subset of the bits, and only perform processing on the subset of bits. The subset of bits selected should most accurately represent the input signal. Thus, the subset selected should be the subset with the most signal information.

Graph 610 illustrates two signals, input signal A and input signal B. Graph 610 represents the range of distortion at the top (the top gray area), and the quantization noise and overall noise floor on the bottom (the bottom gray area). The dynamic range is the range between the distortion and the overall noise floor. Graph 610 also illustrates AGC threshold 612, assuming two different levels of bit selection. As seen to the right of the graph, the signal in the example has 6 bits.

Input signal A has a signal level that is much higher than the noise floor and could potentially be close to the distortion level. Input signal A exceeds AGC threshold 612. In one example, the system selects the 4 MSBs (AGC Level 1) out of the 6 available bits. For signals with high input level, the MSBs can be chosen to reduce the chance of distortion.

Input signal B has a signal level that is lower than AGC threshold 612, and is relatively close to the noise floor. Thus, choosing the 4 MSBs would bury the signal in the noise. The processing component(s) of system 600 can select the 4 LSBs (AGC Level 2) for processing of input signal B.

It will be understood that 6 signal bits are illustrated in system 600, and a different system can have more or fewer bits. More or fewer than the 4 bits of the example can be selected for processing. In one example, the AGC can include more than two levels. For example, system 600 could include a second AGC threshold, creating a third AGC level. A third AGC level could allow selection of the 4 middle bits. More levels of AGC bit selection would generally have more associated AGC thresholds.

Graph 620 illustrates the processing of input signal A, with a new noise floor (bottom gray area) and distortion range (top gray area). Thus, graph 620 has a different dynamic range for the 4-bit signal as compared to the dynamic range of graph 610 for the 6-bit signal. Likewise, in graph 630, the processing of input signal B illustrates the noise floor (bottom gray area) with a new distortion level (top gray area) and different dynamic range for the 4-bit signal.

System 600 illustrates selecting a subset of contiguous bits to carry forward to the rest of the data path, which allows shrinking the dynamic range in steps of 6 dB per bit omitted. In one example, system 600 can perform a digital multiplication (scaling) operation prior to bit selection to achieve less than a 6 dB dynamic range reduction. In one example, system 600 can perform rounding before discarding LSBs.

Figure 7:
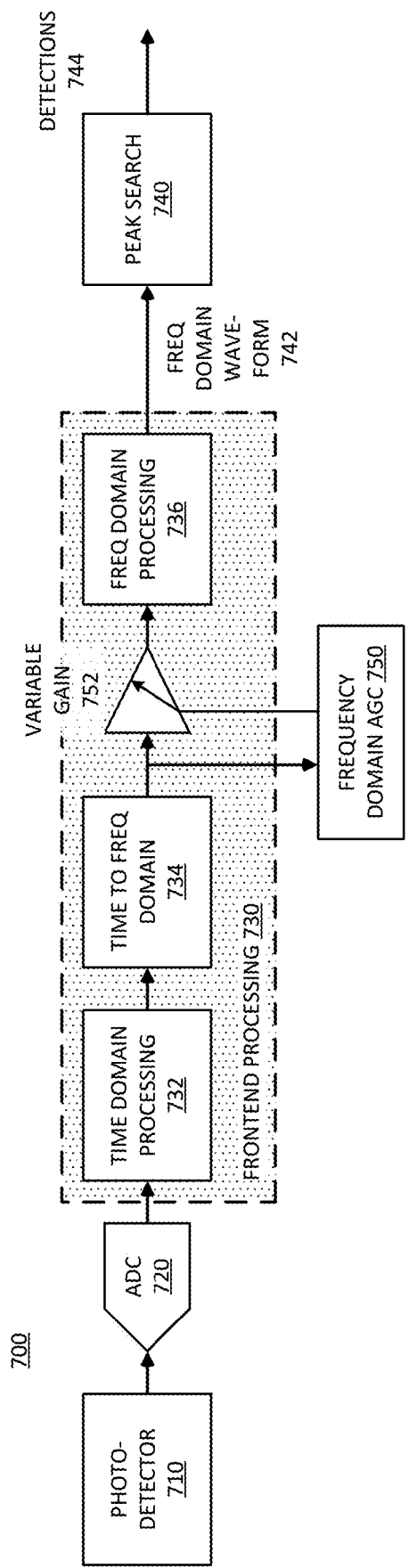
FIG. 7 illustrates an example of AGC in frequency domain digital processing of a LIDAR system.

FIG. 7 illustrates an example of AGC in frequency domain digital processing of a LIDAR system. System 700 represents a system in accordance with embodiments of the present disclosure. System 700 does not illustrate the optical components.

System 700 can detect a return beam signal with photodetector 710 and condition the signal with ADC 720. System 700 provides the conditioned signal for signal processing by frontend processing 730. In one example, frontend processing 730 includes time domain processing 732, time to frequency (FREQ) domain 734, and frequency (FREQ) domain processing 736. Time domain processing 732 can perform time domain filtering of the input signal.

Time to frequency domain 734 represents a frequency transformation to provide a conversion of the signal into a temporal frequency representation. Frequency domain processing 736 can perform processing or filtering on the digital signal in the frequency domain to generate a frequency domain waveform 742. System 700 can include peak search 740 of frequency domain waveform 742 to generate signal detections 744 or computations of estimates of the points of interest, such as a point cloud.

In one example, system 700 includes digital frequency domain AGC 750 prior to frequency domain processing 736, after the conversion of the time domain signal to the frequency domain. After the signal is converted to the frequency domain, frequency domain AGC 750 can measure the signal and apply variable gain 752 based on the signal measurement, to reduce the dynamic range for frequency domain processing. In one example, system 700 can divide the signal into multiple frequency bands, with the signal level in each band measured separately. In one example, a different variable gain can be applied to each band. The number of frequency bands and band boundaries can be decided a-priori or dynamically.

The digital implementation of the digital frequency domain AGC can be the same as the digital time domain AGC described with respect to system 500 and system 600. In one example, digital frequency domain AGC 750 compares the digital signal level to a threshold and adjusts the digital signal with digital multiplication, provided the digital signal is not above the threshold. In one example, the threshold can be multiple thresholds, with different levels of multiplication applied based on different thresholds.

Figure 8:
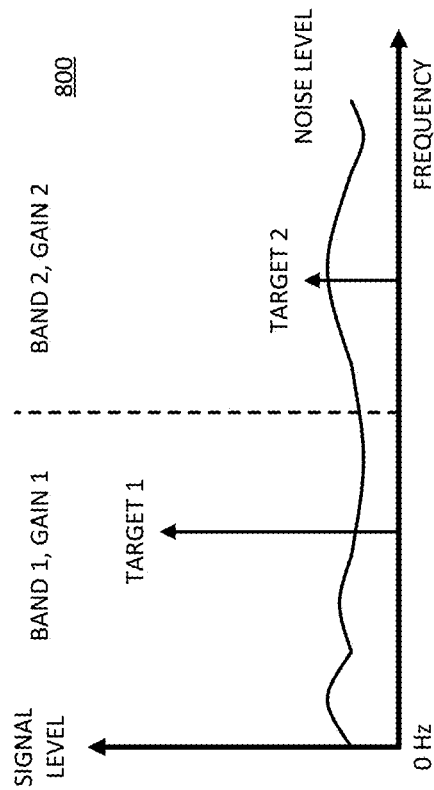
FIG. 8 illustrates an example of digital frequency domain AGC operation.

FIG. 8 illustrates an example of digital frequency domain AGC operation. Diagram 800 illustrates signal processing with digital frequency domain AGC in accordance with an example of system 700.

In diagram 800, the signal for Target 1 is in Band 1, and Gain 1 is applied to the signal for processing. The signal for Target 2 is in Band 2, and Gain 2 is applied to the signal for processing. Gain 1 and Gain 2 can be different levels of gain. Such an AGC can preserve a large dynamic range over the full frequency band, while saving power by significantly limiting the dynamic range in a single band.

It will be understood that 2 targets with large differences in intensity within a single frequency band could generally not be simultaneously detected. Signals for targets in different bands can be detected, even with large differences in signal intensity.

Figure 9:
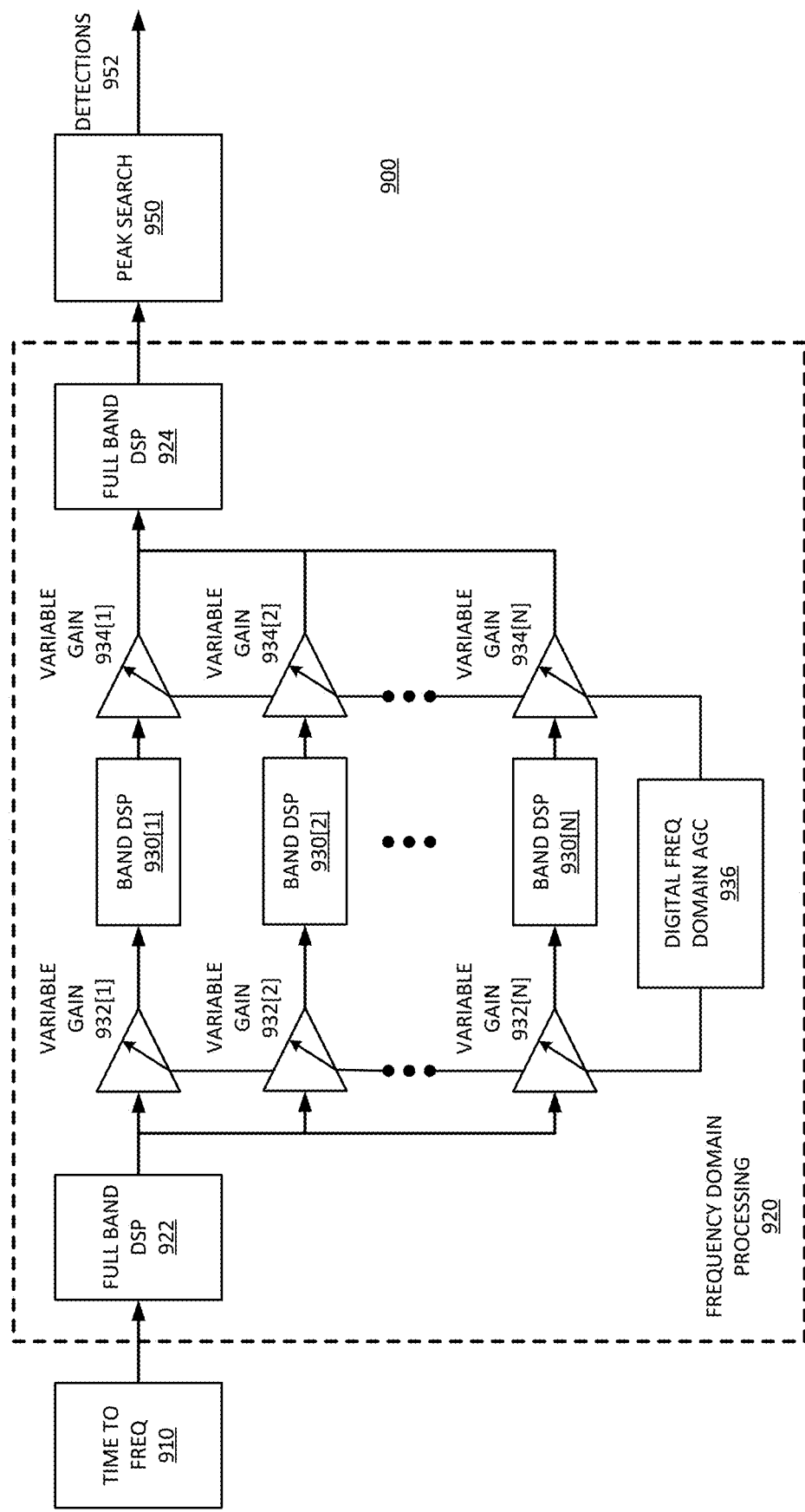
FIG. 9 illustrates an example of digital frequency domain AGC operation in multiple frequency bands.

FIG. 9 illustrates an example of digital frequency domain AGC operation in multiple frequency bands. System 900 illustrates multi-band signal processing with digital frequency domain AGC in accordance with an example of system 700. System 900 illustrates digital frequency domain AGC and variable gain as part of the digital frequency processing.

System 900 illustrates time to frequency conversion, followed by full band DSP (digital signal processing) 922. Time to frequency conversion (time to FREQ) 910 represents a digital processing component to perform a frequency conversion on a time domain digital signal. Frequency domain processing 920 represents digital processing in the frequency domain of the signal output of time to frequency conversion 910. Frequency domain processing 920 includes full band DSP 922 to apply filtering and/or processing on the signal across all frequency bands.

In one example, after full band processing by full band DSP 922, frequency domain processing 920 can split the signals into different bands, applying variable gains to the different bands. The gain to each band can be separately controlled to allow different gains for different bands. System 900 illustrates the different band processing as band DSP 930[1:N], collectively band DSPs 930. System 900 can apply variable gain 932[1:N] (collectively variable gains 932), respectively, to band DSP 930[1:N] prior to the band DSP. System 900 can apply variable gain 934[1:N] (collectively variable gains 934), collectively, to band DSP 930[1:N] after band DSP.

Separating the input signals into different frequency bands allows the system to reduce the power consumption for processing, circuit area, and system cost (operating cost as well as component cost) by processing on signals in lower dynamic ranges. By separating the signals into different bands, each band can be processed at a lower dynamic range, while preserving the overall large dynamic range of the entire frequency band. The splitting into different bands can allow processing on significantly limited dynamic ranges, then recombining restores the dynamic range of the signal for further processing. The processing on the entire band can be simpler because of the processing performed per band, thus minimizing the processing needed on a signal of large dynamic range.

Digital frequency (FREQ) domain AGC 936 can control the application of variable gains 932 and the application of variable gains 934. In one example, variable gains 932 apply signal gain or signal attenuation to process a signal with band DSPs 930, and then variable gains 934 provide gain normalization to return the separate bands to a normalized range for recombining after processing. In one example, during the normalization, any other variable gains applied by optical, analog, or time domain AGC can also be normalized. The normalization can be performed, for example, by padding bits in the MSBs or LSBs, depending on the gain applied, to have signals with information bits aligned to the proper bit range.

After recombining the full band signal, system 900 can apply additional full band DSP 924 to complete the frequency domain processing 920. Frequency domain processing 920 can send its signal output to peak search 950 for peak processing to generate detections 952. It should be noted that, according to some embodiments, frequency domain processing 920 can be performed serially using one band DSP and one set of variable gain components and thus not limited to the depiction in FIG. 9.

Figure 10:
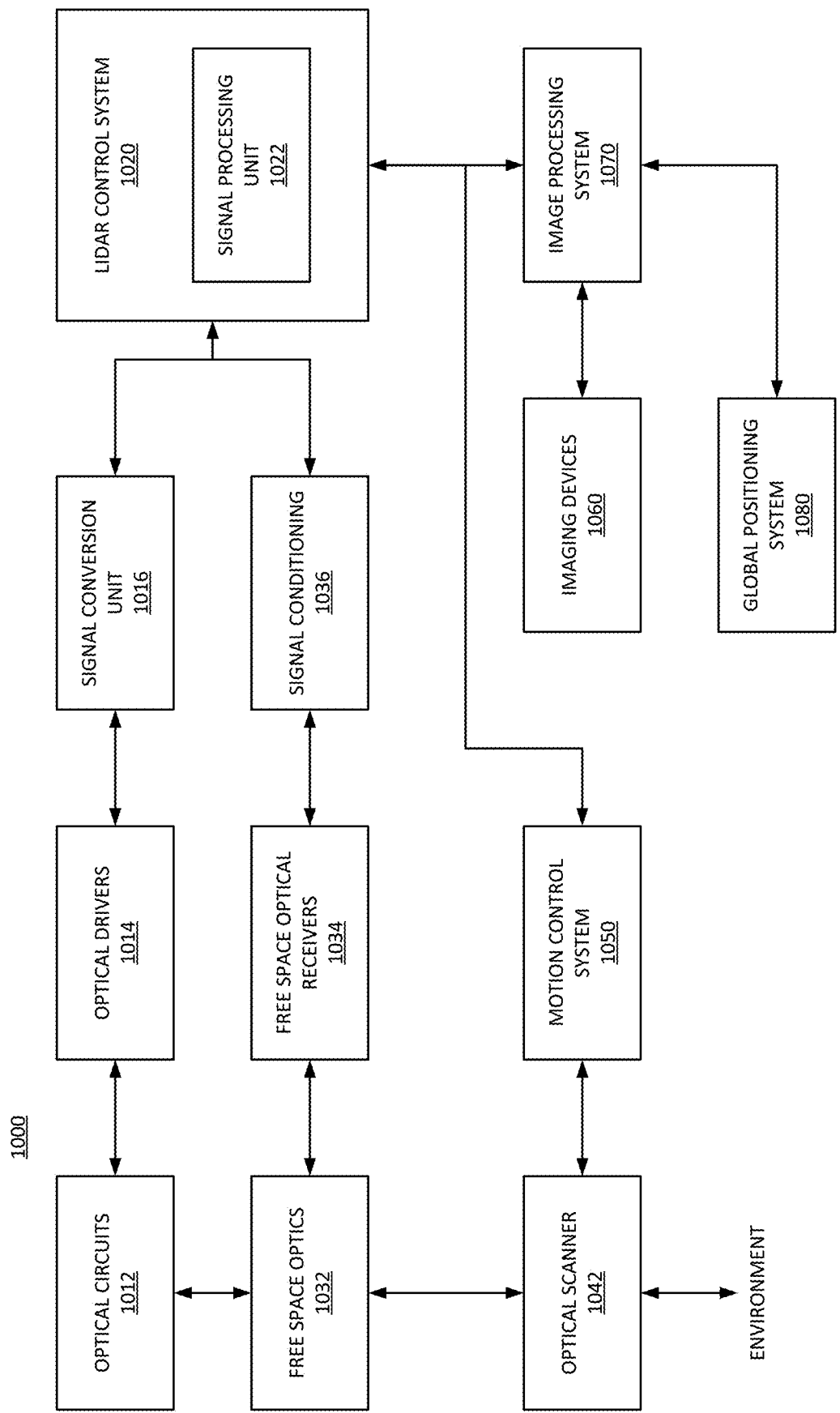
FIG. 10 illustrates an example LIDAR system that can implement AGC.

FIG. 10 illustrates an example LIDAR system that can implement AGC as described herein. LIDAR system 1000 includes one or more of each of a number of components, but may include fewer or additional components than what is illustrated. One or more of the components depicted in LIDAR system 1000 can be implemented on a photonics chip, according to some examples.

As shown, LIDAR system 1000 includes optical circuits 1012 implemented on a photonics chip. In one example, optical circuits 1012 include active optical components. In one example, optical circuits include passive optical components. In one example, optical circuits 1012 include a combination of active optical components and passive optical components. Active optical components refer to components that can generate, amplify, or detect optical signals, or perform a combination of generate, amplify, or detect. In some examples, the active optical component performs operations on optical beams at different wavelengths, and includes one or more optical amplifiers, one or more optical detectors, or other components to perform operations on the light signal.

Free space optics 1032 refers to one or more components that can carry optical signals and route and manipulate optical signals between appropriate input or output ports of the optical circuit and the components of the optical circuit. In one example, free space optics 1032 includes one or more optical components such as taps, wavelength division multiplexers (WDM), splitters/combiners, polarization beam splitters (PBS), collimators, couplers, or other components to direct an optical signal. In some examples, free space optics 1032 includes components to transform the polarization state and direct received polarized light, for example, to optical detectors using a PBS. In one example, free space optics 1032 includes a diffractive element to deflect optical beams having different frequencies at different angles along an axis (e.g., a fast axis).

In some examples, LIDAR system 1000 includes optical scanner 1042 that includes one or more scanning mirrors that are rotatable along an axis (e.g., a slow axis) that is orthogonal or substantially orthogonal to the fast axis of the diffractive element. Optical scanner 1042 can steer optical signals to scan an environment according to a scanning pattern. For instance, the scanning mirrors can be rotatable by one or more galvanometers. Incident light from a source optical signal tends to scatter off objects in a target environment, generating a return optical beam or a target return signal. Optical scanner 1042 can collect the return optical beam or the target return signal and provide the return signal for processing. Optical scanner 1042 can return the signal to passive optical circuit components or active optical circuit components of optical circuits 1012. For example, free space optics 1032 can direct a signal to an optical detector via a polarization beam splitter. In addition to mirrors and galvanometers, examples of optical scanner 1042 can include components such as a quarter-wave plate, lens, anti-reflective coated window, or other component to receive an optical signal.

To control and support optical circuits 1012 and optical scanner 1042, LIDAR system 1000 includes LIDAR control system 1020. LIDAR control system 1020 includes a signal processor, control component, or other device to process control operations for LIDAR system 1000. The signal processor represents a processing device to control the operation of LIDAR system 1000. The signal processor can be or include, for example, one or more general-purpose processing devices such as a microprocessor, central processing unit, processing component, or other controller/processor. The signal processor can be, for example, a complex instruction set computing (CISC) microprocessor, a reduced instruction set computer (RISC) microprocessor, a very long instruction word (VLIW) microprocessor, or a processor implementing other instruction sets, or processors implementing a combination of instruction sets. In one example, the signal processor can be or include one or more special-purpose processing devices such as an application specific integrated circuit (ASIC), a field programmable gate array (FPGA), a digital signal processor (DSP), network processor, or other computation component.

In some examples, LIDAR control system 1020 includes signal processing unit 1022. Signal processing unit 1022 represents a processing device specific for perform signal computations. For example, signal processing unit 1022 can be a DSP. LIDAR control system 1020 can be configured to output digital control signals to control optical drivers 1014. In some examples, the digital control signals can be converted to analog signals through signal conversion unit 1016. For example, signal conversion unit 1016 can include a digital-to-analog converter (DAC). Optical drivers 1014 can provide drive signals to active optical components of optical circuits 1012 to drive optical sources such as lasers and amplifiers. In some examples, several optical drivers 1014 and signal conversion units 1016 can be provided to drive multiple optical sources.

LIDAR control system 1020 can be configured to output digital control signals for optical scanner 1042. Motion control system 1050 can control galvanometers or other movable components of optical scanner 1042 based on control signals received from LIDAR control system 1020. For example, a DAC can convert coordinate routing information from LIDAR control system 1020 to signals interpretable by galvanometers in optical scanner 1042. In some examples, motion control system 1050 can return information to LIDAR control system 1020 about the position or operation of components of optical scanner 1042. For example, an analog-to-digital converter (ADC) can convert information about a galvanometer's position to a signal interpretable by LIDAR control system 1020.

LIDAR control system 1020 can be configured to analyze incoming digital signals. In this regard, LIDAR system 1000 includes free optical receivers 1034 to measure one or more beams received by free space optics 1032, which can also be passed to optical circuits 1012. For example, a reference beam receiver can measure the amplitude of a reference beam from an active optical component, and an ADC converts signals from the reference receiver to signals interpretable by LIDAR control system 1020. Target receivers measure the optical signal that carries information about the range and velocity of a target in the form of a beat frequency, modulated optical signal. The reflected beam can be mixed with a signal from a local oscillator. Optical receivers 1034 can include a high-speed ADC to convert signals from the target receiver to signals interpretable by LIDAR control system 1020. In some examples, signal conditioning unit 1036 can perform signal conditioning on signals from optical receivers 1034 prior to receipt by LIDAR control system 1020. For example, the signals from optical receivers 1034 can be provided to an operational amplifier (op-amp) for amplification of the return signals and the amplified signals can be provided to LIDAR control system 1020.

In some applications, LIDAR system 1000 includes one or more imaging devices 1060 configured to capture images of the environment, global positioning system (GPS) 1080 configured to provide a geographic location of the system, or other sensor inputs. Image processing system 1070 represents one or more components configured to receive the images from imaging devices 1060 or geographic location from GPS 1080 and prepare the information for receipt and use by LIDAR control system 1020 or other system connected to LIDAR system 1000. For example, image information can be pre-processed for use by LIDAR control system 1020. In another example, location information can be formatted for use by LIDAR system 1000.

In some examples, the scanning process begins with optical drivers 1014 and LIDAR control system 1020. LIDAR control system 1020 can instruct optical drivers 1014 to independently modulate one or more optical beams, and these modulated signals propagate through the optical circuit to a collimator. The collimator directs the light at the optical scanning system that scans the environment over a preprogrammed pattern defined by motion control system 1050. Optical circuits 1012 can include a polarization wave plate (PWP) to transform the polarization of the light as it leaves optical circuits 1012. In some examples, the polarization wave plate can be a quarter-wave plate or a half-wave plate. A portion of the polarized light can be reflected back to optical circuits 1012. For example, lensing or collimating systems used in LIDAR system 1000 can have natural reflective properties or a reflective coating to reflect a portion of the light back to optical circuits 1012.

Optical signals reflected back from the environment pass through optical circuits 1012 to the receivers. If the polarization of the light has been transformed, it can be reflected by a polarization beam splitter (PBS) along with the portion of polarized light that was reflected back to optical circuits 1012. Accordingly, rather than returning to the same fiber or waveguide as an optical source, the reflected light can be reflected to separate optical receivers. These signals interfere with one another and generate a combined signal. Each beam signal that returns from the target produces a time-shifted waveform. The temporal phase difference between the two waveforms generates a beat frequency measured on the optical receivers (photodetectors). The combined signal can then be reflected to optical receivers 1034.

Optical receivers 1034 can apply ADCs to convert the analog signals from optical receivers to digital signals. The digital signals are then sent to LIDAR control system 1020. Signal processing unit 1022 can receive the digital signals and interpret them. In some examples, signal processing unit 1022 also receives position data from motion control system 1050 and galvanometers (not shown) as well as image data from image processing system 1070. Signal processing unit 1022 can then generate a 3D point cloud with information about range and velocity of points in the environment as optical scanner 1042 scans additional points. Signal processing unit 1022 can also overlay a 3D point cloud data with the image data to determine velocity and distance of objects in the surrounding area. In one example, LIDAR system 1000 processes satellite-based navigation location data to provide a precise global location.

In operation according to some examples, LIDAR system 1000 can be configured to provide AGC. The AGC can be applied anywhere in the signal path, in accordance with any example provided. In one example, the AGC can be applied to an optical signal in an optical time domain signal path. In one example, the AGC can be applied to an electrical signal in an analog time domain signal path. In one example, the AGC can be applied to a digital signal in a time domain signal path. In one example, the AGC can be applied to a digital signal in a frequency domain signal path. AGC can be applied at more than one location in a signal path.

Figure 11:
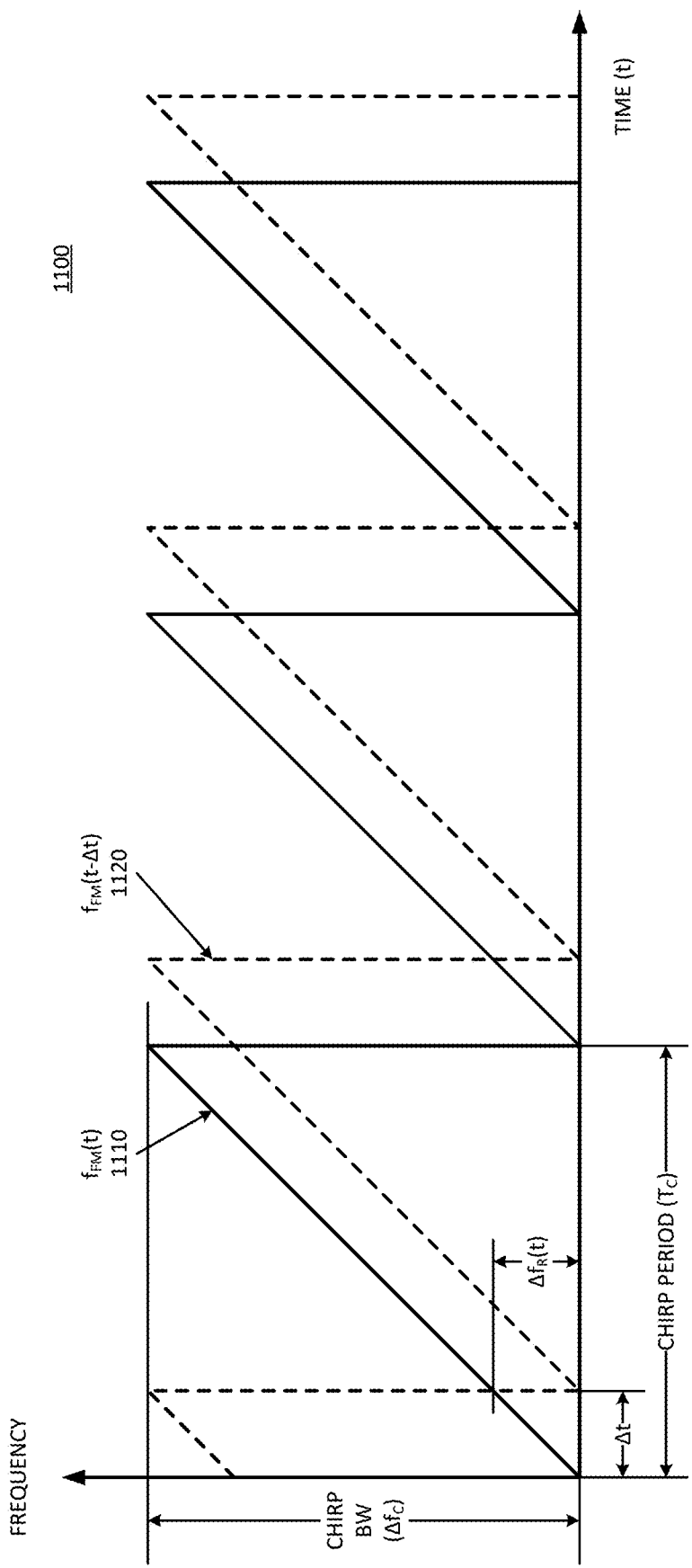
FIG. 11 represents a time-frequency diagram illustrating an example of LIDAR waveform detection and processing.

FIG. 11 represents a time-frequency diagram illustrating an example of LIDAR waveform detection and processing. Diagram 1100 represents a time-frequency diagram of an FMCW scanning signal 1110 that can be used by a LIDAR system in accordance with embodiments of the present disclosure to scan a target environment according to some examples. In one example, the scanning waveform 1110, labeled as $f_{FM}(t)$, can be a sawtooth waveform (sawtooth "chirp") with a chirp bandwidth $\Delta f_C$ and a chirp period $T_C$.

The slope of the sawtooth is given as $k=(\Delta f_C/T_C)$. Diagram 1100 also depicts target return signal 1120 according to some examples. Target return signal 1120, labeled as $f_{FM}(t-\Delta t)$, is a time-delayed version of scanning signal 1110, where $\Delta t$ is the roundtrip time to and from a target illuminated by scanning signal 1110. The roundtrip time can be given as $\Delta t=11R/v$, where R is the target range, and v is the velocity of the optical beam, which can be the speed of light c. The target range, R, can therefore be calculated as $R=c(\Delta t/2)$.

When return signal 1120 is optically mixed with scanning signal 1110, a range-dependent difference frequency, referred to as the beat frequency, $\Delta f_R(t)$ can be generated. The beat frequency $\Delta f_R(t)$ can be linearly related to the time delay, $\Delta t$, by the slope of the sawtooth k. Thus, $\Delta f_R(t)=k\Delta t$. Since the target range R is proportional to $\Delta t$, the target range R can be calculated as $R=(c/2)(\Delta f_R(t)/k)$. Thus, the range R is linearly related to the beat frequency $\Delta f_R(t)$.

The beat frequency $\Delta f_R(t)$ can be generated, for example, as an analog signal in optical receivers 1034 of system 1000. The beat frequency can then be digitized by an ADC, for example, in a signal conditioning unit such as signal conditioning unit 1036 in LIDAR system 1000. The digitized beat frequency signal can then be digitally processed, for example, in a signal processing unit, such as signal processing unit 1022 in system 1000.

It will be understood that target return signal 1120 will, in general, also include a frequency offset (Doppler shift) if the target has a velocity relative to the LIDAR system. The Doppler shift can be determined separately, and used to correct the frequency of the return signal, so the Doppler shift is not shown in diagram 1100 for simplicity and ease of explanation. It should also be noted that the sampling frequency of the ADC will determine the highest beat frequency that can be processed by the system without aliasing. In general, the highest frequency that can be processed is one-half of the sampling frequency (i.e., the "Nyquist limit").

In one example, and without limitation, if the sampling frequency of the ADC is 1 gigahertz, then the highest beat frequency that can be processed without aliasing ($\Delta f_{Rmax}$) is 500 megahertz. This limit in turn determines the maximum range of the system as $Rmax=(c/2)(\Delta f_{Rmax}/k)$ which can be adjusted by changing the chirp slope k. In one example, while the data samples from the ADC may be continuous, the subsequent digital processing described below may be partitioned into "time segments" that can be associated with some periodicity in the LIDAR system. In one example, and without limitation, a time segment might correspond to a predetermined number of chirp periods T, or a number of full rotations in azimuth by the optical scanner.

Figure 12:
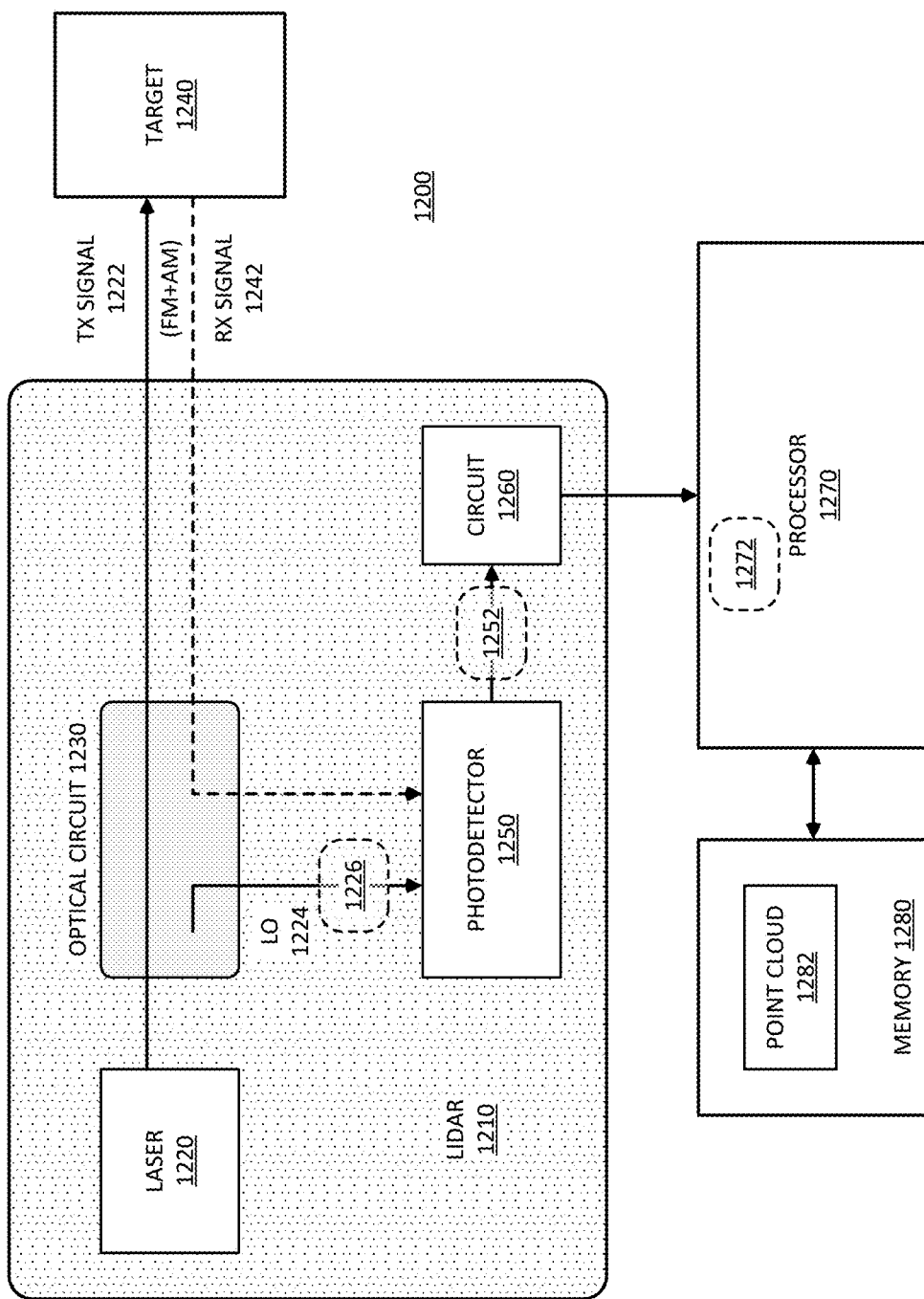
FIG. 12 illustrates an example of a LIDAR system that provides AGC for a LIDAR signal.

FIG. 12 illustrates an example of a LIDAR system that provides AGC for a LIDAR signal. System 1200 represents a system in accordance with embodiments of the present disclosure. System 1200 includes LIDAR 1210, which represents a LIDAR system in accordance with any example herein.

In one example, LIDAR 1210 represents an optical chip, which can be coupled to a processor device or processor chip and a memory device or memory chip. In one example, system 1200 can be a single device with LIDAR, processing, and memory components in a single device or device package. In one example, LIDAR 1210 can be one of multiple LIDAR components coupled to a processing device.

LIDAR 1210 includes laser 1220 to provide an optical signal. Optical circuit 1230 includes one or more optical circuit components or elements to provide modulation, reference signaling, optical combining or other optical manipulation of an optical signal, amplification or attenuation, or other operation on an optical signal for system 1200. The modulation can be active or passive. Optical circuit 1730 provides the modulation and optics to transmit TX signal 1222 to target 1240 and receive the reflection signal represented by RX signal 1242.

Photodetector 1250 can receive RX signal 1242 from optical circuit 1230 from target 1240, and LO signal 1224 from optical circuit 1230 from laser 1220. System 1200 can condition the signal with one or more circuit components, represented by circuit 1260. In one example, circuit 1260 includes an ADC component. Circuit 1260 can condition the received signal detected by photodetector 1250.

Processor 1270 represents a processor device or processing unit. Processor 1270 can be a standalone component or be integrated in a computer system. Processor 1270 can provide time domain and frequency domain processing. Processor 1270 can compute or determine a target range value for target 1240 and/or a target velocity value for target 1240 based on the optical signal scanning and detected reflection signals.

The values generated can be part of a point cloud of information to map an environment of target 1240. In one example, system 1200 includes memory 1280 coupled to processor 1270 to store information computed by processor 1270, and to provide data for computation by processor 1270. In one example, memory 1280 stores point cloud 1282, to represent the information gathered by scanning target 1240 with LIDAR 1210. Point cloud 1282 can be or include estimates or values computed by processor 1270 based on scanning target 1240.

In one example, system 1200 includes AGC. Various AGC elements are represented in system 1200. In one example, system 1200 includes more than one of an optical AGC at LO path 1226, an analog AGC at path 1252, a time domain AGC (one example of AGC 1272 in processor 1270), or a frequency domain AGC (another example of AGC 1272 in processor 1270).

In one example, system 1200 includes an AGC at LO path 1226. Such an AGC can be referred to as an optical AGC, to provide variable gain to a light signal. The variable gain can increase the gain when the signal is lower than a threshold, and the variable gain can attenuate the signal to fit within a smaller dynamic range of subsequent processing elements. In one example, system 1200 includes an AGC at path 1252, between photodetector 1250 and circuit 1260. In one example, the AGC can be considered part of circuit 1260. The AGC at path 1252 can be referred to as an analog AGC. The analog AGC can provide variable gain to an electrical signal generated from a detected return beam. The variable gain can increase the gain when the signal is lower than a threshold, and the variable gain can attenuate the signal to fit within a smaller dynamic range of subsequent processing elements.

In one example, processor 1270 includes AGC 1272. In one example, AGC 1272 can represent a time domain AGC or digital time domain AGC in a digital processing path of the signal received from LIDAR 1210. The digital time domain AGC can provide variable gain to a digital signal within processor 1270. The variable gain can increase the gain when the signal is lower than a threshold, and the variable gain can attenuate the signal to fit within a smaller dynamic range for subsequent processing.

In one example, AGC 1272 can represent a frequency domain AGC or digital frequency domain AGC in a digital processing path of the signal received from LIDAR 1210. The digital frequency domain AGC can provide variable gain to a frequency signal within processor 1270. The variable gain can increase the gain when the signal is lower than a threshold, and the variable gain can attenuate the signal to fit within a smaller dynamic range for subsequent processing.

Besides what is described herein, various modifications can be made to the disclosed embodiments and implementations of the invention without departing from their scope. Therefore, the illustrations and examples herein should be construed in an illustrative, and not a restrictive sense.

What is claimed is:

1. A frequency modulated continuous wave (FMCW) light detection and ranging (LIDAR) system, comprising:
   a photodetector to detect a return beam received from a target, the return beam comprising a first difference between a first highest intensity and a first lowest intensity;
   an analog to digital converter (ADC) to generate a digital signal based on the return beam detected at the photodetector; and
   an automatic gain control (AGC) unit to:
   apply a variable gain to the digital signal in a time domain to reduce the first difference to a second difference comprising a second highest intensity and a second lowest intensity beam to increase a signal strength of the digital signal for processing by a processor resident on the FMCW LIDAR system.

2. The FMCW LIDAR system of claim 1, further comprising:
   a splitter to separate a first portion of a transmit signal to produce the return beam and a second portion of the transmit signal to produce a local oscillator (LO) signal, wherein the AGC unit further comprises an optical AGC unit to apply the variable gain in the time domain to the LO signal.

3. The FMCW LIDAR system of claim 2, wherein the AGC unit is to:
   measure the return beam;
   provided the return beam exceeds a threshold, attenuate the LO signal with an optical attenuator; and
   provided the return beam does not exceed the threshold, increase the variable gain.

4. The FMCW LIDAR system of claim 2, wherein the AGC unit is to:
   measure the return beam; and
   provided the return beam does not exceed a threshold, increase an amount of the first portion of the transmit signal relative to the second portion of the transmit signal.

5. The FMCW LIDAR system of claim 1, wherein the AGC unit comprises an analog AGC unit between the photodetector and the ADC, wherein the analog AGC unit is to:
   measure an output of the photodetector; and
   apply gain with a variable gain amplifier to provide the return beam with the second difference.

6. The FMCW LIDAR system of claim 1, wherein the AGC unit comprises a digital AGC unit in the processor, wherein the digital AGC unit is to:

measure instantaneous power of the digital signal to determine a digital signal level; and
adjust the digital signal with variable gain to provide the digital signal with the second difference.

7. The FMCW LIDAR system of claim 6, wherein the AGC unit is to:
compare the digital signal level to a threshold; and
provided the digital signal is not above the threshold, adjust the digital signal with digital multiplication.

8. The FMCW LIDAR system of claim 6, wherein the digital signal has an associated number of bits, and wherein the digital AGC unit is to:
compare the digital signal level to a threshold to divide the first difference into multiple reduced ranges; and
provided the digital signal is above the threshold, select a subset of the number of bits based on which of the multiple reduced ranges the digital signal belongs to; and
perform processing on the subset of the number of bits.

9. A method for a frequency modulated continuous wave (FMCW) light detection and ranging (LIDAR) system, comprising:
detecting a return beam received from a target, the return beam comprising a first difference between a first highest intensity and a first lowest intensity;
generating a digital signal based on the return beam detected; and
applying variable gain to the digital signal in a time domain to reduce the first difference to a second difference comprising a second highest intensity and a second lowest intensity beam to increase a signal strength of the digital signal for processing by a processor resident on the FMCW LIDAR system.

10. The method of claim 9, further comprising:
separating a first portion of a transmit signal to produce the return beam and a second portion of the transmit signal to produce a local oscillator (LO) signal;
wherein applying the variable gain further comprises applying the variable gain in the time domain to the LO signal.

11. The method of claim 10, wherein applying the variable gain comprises:
measuring the return beam;
provided the return beam exceeds a threshold, attenuating the LO signal with an optical attenuator; and
provided the return beam does not exceed the threshold, increasing an amount of the first portion of the transmit signal relative to the second portion of the transmit signal.

12. The method of claim 9, wherein applying the variable gain comprises applying the variable gain with an analog automatic gain control (AGC) unit between a photodetector and an analog to digital converter (ADC), including:
measuring an output of the photodetector; and
applying gain with a variable gain amplifier to provide the return beam with the second difference.

13. The method of claim 9, wherein applying the variable gain comprises applying the variable gain with a digital automatic gain control (AGC) unit, including:
measuring instantaneous power of the digital signal to determine a digital signal level; and
adjusting the digital signal with variable gain to provide the digital signal with the second difference.

14. The method of claim 13, wherein applying the variable gain comprises:
comparing the digital signal level to a threshold; and
provided the digital signal is not above the threshold, adjusting the digital signal with digital multiplication.

15. The method of claim 13, wherein the digital signal has an associated number of bits, and wherein applying the variable gain comprises:
comparing the digital signal level to a threshold to divide the first difference into multiple reduced ranges; and
provided the digital signal is above the threshold, selecting a subset of the number of bits based on which of the multiple reduced ranges the digital signal belongs to; and
performing processing on the subset of the number of bits.

16. A frequency modulated continuous wave (FMCW) light detection and ranging (LIDAR) system, comprising:
a light source to generate a light signal;
an optical circuit comprising
a modulator to modulate the light signal to generate a pulsed light signal transmitted towards a target; and
a photodetector to detect a return beam from the target based on the pulsed light signal, the return beam comprising a first difference between a first highest intensity and a first lowest intensity;
an analog to digital converter (ADC) to generate a digital signal based on the return beam detected at the photodetector; and
an automatic gain control (AGC) unit to:
apply a variable gain to the digital signal in a time domain to reduce the first difference to a second difference comprising a second highest intensity and a second lowest intensity to increase a signal strength of the digital signal for processing;
a processing device coupled to the photodetector configured to:
perform time domain processing on the digital signal in the time domain;
convert the digital signal from the time domain to a frequency domain; and
perform frequency domain processing on the digital signal in the frequency domain.

17. The FMCW LIDAR system of claim 16, further comprising:
a splitter to separate a first portion of the light signal toward the target and a second portion of the light signal toward the photodetector to produce a local oscillator (LO) signal;
wherein the AGC unit further comprises an optical AGC unit to apply the variable gain in the time domain to the LO signal.

18. The FMCW LIDAR system of claim 16, wherein the AGC unit comprises an analog AGC unit between the photodetector and the ADC, wherein the analog AGC unit is to:
measure an output of the photodetector; and
gain the light signal with a variable gain amplifier to produce the second difference.

19. The FMCW LIDAR system of claim 16, wherein the AGC unit comprises a digital AGC unit in the processing device, wherein the digital AGC unit is to:
measure instantaneous power of the digital signal to determine a digital signal level; and
adjust the digital signal with variable gain to produce the second difference.

20. The FMCW LIDAR system of claim 16, further comprising:

optics to transmit the pulsed light signal and direct the return beam to the photodetector.

* * * * *